(12) United States Patent
Heuser et al.

(10) Patent No.: US 9,431,635 B2
(45) Date of Patent: Aug. 30, 2016

(54) LIGHT-EMITTING COMPONENT AND METHOD FOR PRODUCING A LIGHT-EMITTING COMPONENT

(75) Inventors: Karsten Heuser, Erlangen (DE); Daniel Steffen Setz, Boeblingen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/131,913

(22) PCT Filed: May 31, 2012

(86) PCT No.: PCT/EP2012/060237
§ 371 (c)(1),
(2), (4) Date: Jan. 10, 2014

(87) PCT Pub. No.: WO2013/007444
PCT Pub. Date: Jan. 17, 2013

(65) Prior Publication Data
US 2014/0167019 A1     Jun. 19, 2014

(30) Foreign Application Priority Data
Jul. 12, 2011   (DE) .......................... 10 2011 078 998

(51) Int. Cl.
*H01L 35/24*   (2006.01)
*H01L 51/00*   (2006.01)
*H01L 51/56*   (2006.01)
*H01L 51/52*   (2006.01)

(52) U.S. Cl.
CPC ............ *H01L 51/56* (2013.01); *H01L 51/524* (2013.01); *H01L 51/5268* (2013.01); *H01L 51/5275* (2013.01); *H01L 2251/5369* (2013.01)

(58) Field of Classification Search
CPC ............ H01L 225/5369; H01L 51/52; H01L 51/524; H01L 51/56
USPC ............................................ 257/40; 438/29
See application file for complete search history.

(56) References Cited

U.S. PATENT DOCUMENTS

| | | | |
|---|---|---|---|
| 7,109,651 B2 | 9/2006 | Nakamura et al. | |
| 7,608,371 B2 | 10/2009 | Ueno et al. | |
| 2004/0195962 A1 | 10/2004 | Nakamura et al. | |
| 2005/0254130 A1 | 11/2005 | Graf et al. | |
| 2007/0160846 A1* | 7/2007 | Koinuma ............... | C09K 19/38 428/411.1 |
| 2010/0060134 A1 | 3/2010 | Saito et al. | |
| 2012/0231178 A1* | 9/2012 | Svasand ............... | H05K 9/0079 427/532 |

FOREIGN PATENT DOCUMENTS

DE     10064277 A1    7/2002
DE     10207564 C1    11/2003

(Continued)

OTHER PUBLICATIONS

Office Action received for Korean Patent Application No. 10 2014 7003673, mailed on Jan. 16, 2015, 4 pages of office action and 3 pages of English translation.

(Continued)

*Primary Examiner* — Cuong Q Nguyen
(74) *Attorney, Agent, or Firm* — Viering, Jentschura & Partner mbB (57) ABSTRACT

A light-emitting component may include: an electrically active region, including: a first electrode; a second electrode; and an organic functional layer structure between the first electrode and the second electrode; and a thermotropic layer, which is arranged outside the electrically active region.

10 Claims, 8 Drawing Sheets

(56) References Cited

FOREIGN PATENT DOCUMENTS

| EP | 1424739 A2 | 6/2004 |
|---|---|---|
| EP | 2151877 A1 | 2/2010 |
| JP | 2009110930 A | 5/2009 |
| KR | 1020040047670 A | 6/2004 |

OTHER PUBLICATIONS

English language abstract of DE 10064277 A1 dated Jul. 25, 2002.
International Search Report issued in the corresponding PCT Application No. PCT/EP2012/060237, dated Nov. 20, 2012, 12 pgaes.
English translation of International Preliminary Report on Patentability issued in the corresponding PCT Application No. PCT/EP2012/060237, dated Jan. 14, 2014, 8 pgaes.
Arno Seeboth et al., "Thermotropic and Thermochromic Polymer Based Materials for Adaptive Solar Control", Materials 2010, Dec. 6, 2010, 5143-5168, vol. 3.
Korean Office Action based on Application No. 10-2014-7003673 (4 pages) dated Aug. 27, 2015 (Reference Purpose Only).
Korean Office Action based on Application No. 2014-7003673 (4 Pages) dated Jun. 17, 2016 (Reference Purpose Only).

* cited by examiner

LIGHT-EMITTING COMPONENT AND METHOD FOR PRODUCING A LIGHT-EMITTING COMPONENT

RELATED APPLICATIONS

The present application is a national stage entry according to 35 U.S.C. §371 of PCT application No.: PCT/EP2012/060237 filed on May 31, 2012, which claims priority from German application No.: 10 2011 078 998.7 filed on Jul. 12, 2011, and is incorporated herein by reference in its entirety.

TECHNICAL FIELD

Various embodiments relate to a light-emitting component and to a method for producing a light-emitting component.

BACKGROUND

Figure 1:
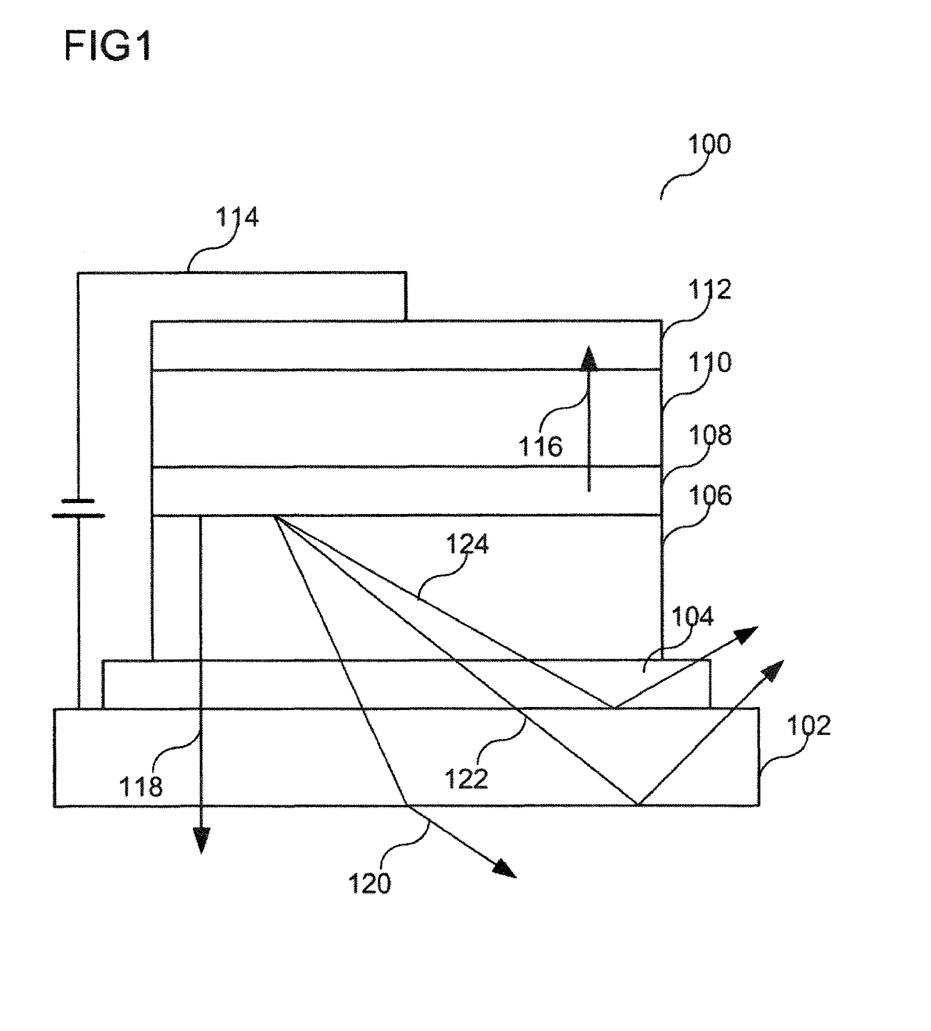
FIG. 1 shows a cross-sectional view of a conventional light-emitting component.

In an organic light-emitting diode, the light generated by said organic light-emitting diode is partly coupled out directly from the organic light-emitting diode. The rest of the light is distributed into various loss channels, as is illustrated in an illustration of an organic light-emitting diode 100 in FIG. 1. FIG. 1 shows an organic light-emitting diode 100 having a glass substrate 102 and a transparent first electrode layer 104 for example composed of indium tin oxide (ITO) and arranged on said glass substrate. Arranged on the first electrode layer 104 is a first organic layer 106, on which an emitter layer 108 is arranged. A second organic layer 110 is arranged on the emitter layer 108. Furthermore, a second electrode layer 112 for example composed of a metal is arranged on the second organic layer 110. An electric current supply 114 is coupled to the first electrode layer 104 and to the second electrode layer 112 such that an electric current for generating light is passed through the layer structure arranged between the electrode layers 104, 112. A first arrow 116 symbolizes a transfer of electrical energy in surface plasmons into the second electrode layer 112. A further loss channel can be seen in absorption losses in the light emission path (symbolized by means of a second arrow 118). Light not coupled out from the organic light-emitting diode 100 in a desired manner is for example a portion of the light which arises on account of a reflection of a portion of the generated light at the interface between the glass substrate 102 and air (symbolized by means of a third arrow 122) and on account of a reflection of a portion of the generated light at the interface between the first electrode layer 104 and the glass substrate 102 (symbolized by means of a fourth arrow 124). That portion of the generated light which is coupled out from the glass substrate 102 is symbolized by means of a fifth arrow 120 in FIG. 1. Illustratively, therefore, for example the following loss channels are present: light loss in the glass substrate 102, light loss in the organic layers and the transparent electrode 104, 106, 108, 110 and surface plasmons generated at the metallic cathode (second electrode layer 112). These light portions cannot readily be coupled out from the organic light-emitting diode 100.

For coupling out substrate modes, so-called coupling-out films are conventionally applied on the underside of the substrate of an organic light-emitting diode, and can couple the light out from the substrate by means of optical scattering or by means of microlenses. It is furthermore known to structure the free surface of the substrate directly. However, such a method considerably influences the appearance of the organic light-emitting diode. This is because a milky surface of the substrate arises as a result.

For coupling out the light in the organic layers of the organic light-emitting diode, various approaches currently exist, but as yet none of these approaches has matured to product readiness.

These approaches are, inter alia:
Introducing periodic structures into the active layers of the organic light-emitting diode (photonic crystals). However, these have a very great dependence on wavelength since the photonic crystals can only couple out specific wavelengths.
Using a high refractive index substrate for directly coupling the light of the organic layers into the substrate. This approach is very cost-intensive on account of the high costs for a high refractive index substrate. Furthermore a high refractive index substrate relies on further coupling-out aids in the form of microlenses, scattering films (each having a high refractive index) or surface structurings Furthermore, a thermotropic glass layer for adapting the transparency of a window glass is known and available from the company Tilse under the designation Solardimc®.

SUMMARY

Various embodiments increase the coupling-out of light from a light-emitting component, for example an organic light-emitting diode, whilst at the same time maintaining a specularly reflective appearance of the light-emitting component (for example in the case of a component that emits light on one side), or whilst at the same time maintaining the optical transparency of the light-emitting component (for example in the case of a component that emits light on two sides) in the switched-off state.

Various embodiments provide a light-emitting component. The light-emitting component may include an electrically active region and a thermotropic layer, which is arranged outside the electrically active region. The electrically active region may include a first electrode; a second electrode; and an organic functional layer structure between the first electrode and the second electrode.

In one configuration, the thermotropic layer may include a matrix material in which particles are embedded, which are designed in such a way that they vary their refractive index depending on temperature.

In another configuration, the matrix material may include polymer material.

In another configuration, the particles may include microparticles.

In another configuration, the light-emitting component may furthermore include a substrate; wherein the thermotropic layer is arranged between the electrically active region and the substrate.

In another configuration, the light-emitting component may furthermore include a substrate and a first cover, wherein the first cover is arranged on that side of the substrate which faces away from the electrically active region; and wherein the thermotropic layer is arranged between the substrate and the first cover.

In another configuration, the light-emitting component may furthermore include a substrate and an encapsulation, which is arranged on that side of the electrically active region which faces away from the substrate; and wherein the thermotropic layer is arranged above the encapsulation.

In another configuration, the light-emitting component may furthermore include a substrate; an encapsulation, wherein the encapsulation is arranged on that side of the electrically active region which faces away from the substrate; and a second cover arranged above the encapsulation; wherein the thermotropic layer is arranged above the second cover.

In another configuration, the light-emitting component may furthermore include an encapsulation, wherein the encapsulation is arranged on that side of the electrically active region which faces away from the substrate; and a second thermotropic layer, wherein the second thermotropic layer is arranged above the encapsulation.

In another configuration, the light-emitting component may furthermore include an encapsulation, wherein the encapsulation is arranged on that side of the electrically active region which faces away from the substrate; a second cover arranged above the encapsulation; and a second thermotropic layer, wherein the second thermotropic layer is arranged above the second cover.

In another configuration, the light-emitting component may be designed as an organic light-emitting diode.

Various embodiments provide a method for producing a light-emitting component. The method may include forming an electrically active region and forming a thermotropic layer outside the electrically active region. Forming an electrically active region may include forming a first electrode; forming a second electrode; and forming an organic functional layer structure between the first electrode and the second electrode.

The configurations of the light-emitting component correspondingly apply, in so far as is practical, to the method for producing a light-emitting component.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the disclosure can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present disclosure. It goes without saying that the features of the various exemplary embodiments described herein can be combined with one another, unless specifically indicated otherwise. Therefore, the following detailed description should not be interpreted in a restrictive sense, and the scope of protection of the present disclosure is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, a light-emitting component may be embodied as an organic light-emitting diode (OLED), or as an organic light-emitting transistor. In various embodiments, the light-emitting component can be part of an integrated circuit. Furthermore, a plurality of light-emitting components can be provided, for example in a manner accommodated in a common housing.

Figure 2:
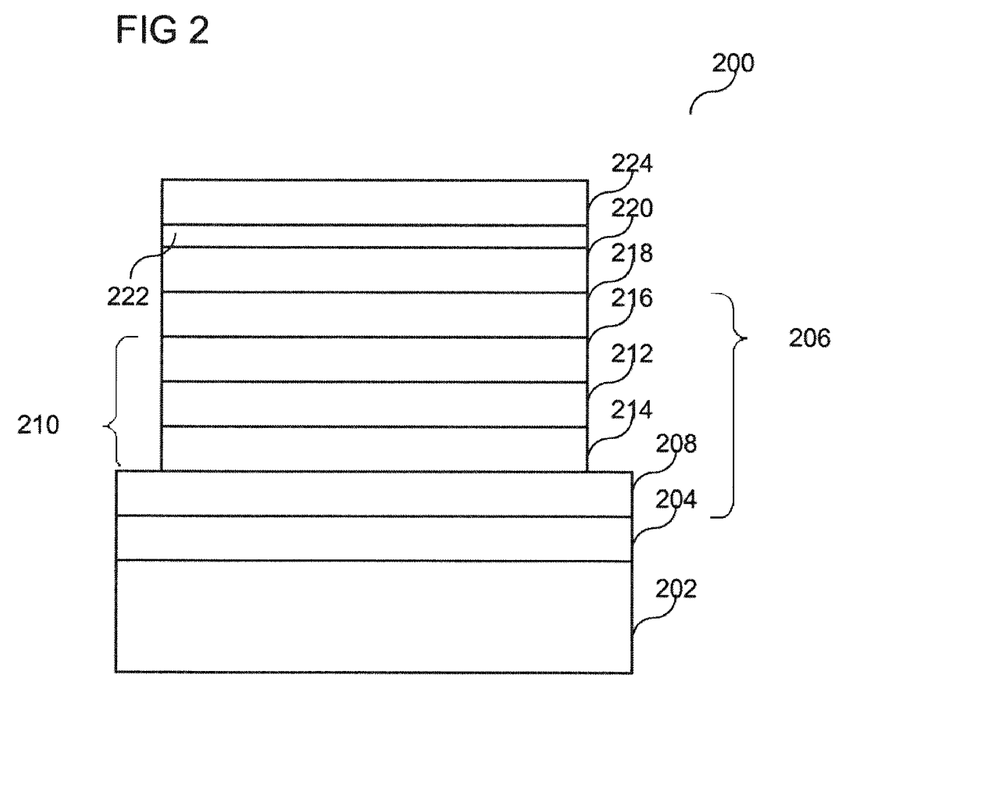
FIG. 2 shows a cross-sectional view of a light-emitting component in accordance with various embodiments.

FIG. 2 shows a cross-sectional view of a light-emitting component 200 in accordance with various embodiments.

The light-emitting component 200 in the form of an organic light-emitting diode 200 can have a substrate 202. The substrate 202 can serve for example as a carrier element for electronic elements or layers, for example light-emitting elements. By way of example, the substrate 202 may include or be formed from glass, quartz, and/or a semiconductor material or any other suitable material. Furthermore, the substrate 202 may include or be formed from a plastic film or a laminate having one or having a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyether sulfone (PES) and/or polyethylene naphthalate (PEN). Furthermore, the substrate 202 may include for example a metal film, for example an aluminum film, a high-grade steel film, a copper film or a combination or a layer stack thereof. The substrate 202 may include one or more of the materials mentioned above. The substrate 202 can be embodied as translucent or even transparent.

In various exemplary embodiments, the term "translucent" or "translucent layer" can be understood to mean that a layer is transmissive to light, for example to the light generated by the light-emitting component, for example in one or more wavelength ranges, for example to light in a wavelength range of visible light (for example at least in a partial range of the wavelength range of from 380 nm to 780 nm). By way of example, in various exemplary embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light-emitting monochromatic or emission spectrum-limited electronic component is intended to be provided, it suffices for the optically translucent layer structure to be translucent at least in a partial range of the wavelength range of the desired monochromatic light or for the limited emission spectrum.

In various embodiments, the organic light-emitting diode 200 (or else the light-emitting components in accordance with the embodiments that have been described above or will be described below) can be designed as a so-called top emitter and/or as a so-called bottom emitter. In various embodiments, a top emitter can be understood to be an organic light-emitting diode in which the light is emitted from the organic light-emitting diode toward the top for example through the second electrode, as will be explained in even greater detail below. In various embodiments, a bottom emitter can be understood to be an organic light-emitting diode in which the light is emitted from the organic light-emitting diode toward the bottom, for example through the substrate and a first electrode, as will be explained in even greater detail below.

A thermotropic layer 204 can be applied on or above the substrate 202.

In various embodiments, a thermotropic layer 204 may be understood to be a layer or a plurality of layers containing at least one layer (designated as matrix) containing thermotropic particles that are designed in such a way that they vary their refractive index depending on the temperature of the layer. In various embodiments, the thermotropic particles in the layer 204 can be designed in such a way that they change their refractive index relatively in a range of approximately 1% to approximately 10%, for example in a range of approximately 3% to approximately 8%, for example in a range of approximately 4% to approximately 7%, for example in a range of approximately 4.5% to approximately 6%, for example in a range of approximately 4.75% to approximately 5%, for example in the case of an increase in the temperature of the layer by at least 5° C., for example by at least 10° C., for example by at least 15° C., for example by at least 17° C., for example by at least 19° C., for example by at least 20° C., for example in the case of an increase in the temperature of the layer of approximately 20° C. to approximately 50° C., for example in the case of an increase in the temperature of the layer of approximately 25° C. to approximately 45° C., for example in the case of an increase in the temperature of the layer of approximately 30° C. to approximately 40° C. Alternatively, in various embodiments, a thermotropic layer 204 can be understood to be a layer or a plurality of layers containing at least one layer (designated as matrix) containing particles, wherein the matrix is designed in such a way that it varies its refractive index depending on the temperature of the layer compared with the refractive index of the particles contained in the matrix.

By way of example, the matrix of the thermotropic layer 204 with the light-emitting component being switched off (illustratively not additionally heated) can have a refractive index in a range of approximately 1.4 to approximately 1.9, for example in a range of 1.5 to approximately 1.7, for example in a range of approximately 1.46 to approximately 1.54, for example in a range of approximately 1.47 to approximately 1.53, for example in a range of approximately 1.48 to approximately 1.52, for example in a range of approximately 1.49 to approximately 1.51, for example a refractive index of approximately 1.49 or a refractive index of approximately 1.50. In the switched-off (illustratively not heated) state, the thermotropic particles contained in the matrix have a refractive index which does not differ or differs only minimally from the refractive index of the matrix. As a result, in the switched-off state, no light scattering is brought about and the thermotropic layer is transparent.

Furthermore, the particles in the thermotropic layer 204 for example with the light-emitting component being switched on (illustratively additionally heated) can change their refractive index in order that the latter deviates from the refractive index of the matrix and light scattering is thus brought about. The thermotropic layer thus becomes translucent. The greater the resulting difference in refractive index between the matrix of the thermotropic layer and the particles, the greater the light-scattering effect of the layer. For a refractive index of the matrix of the thermotropic layer of 1.5, for example, the thermotropic particles can have for example a refractive index in a range of approximately 1.37 to approximately 1.44, for example in a range of approximately 1.38 to approximately 1.43, for example in a range of approximately 1.39 to approximately 1.42, for example in a range of approximately 1.40 to approximately 1.41, for example a refractive index of approximately 1.43 or a refractive index of approximately 1.43.

Consequently, in various embodiments, the thermotropic layer 204 can be transparent at a first temperature, which lies below a threshold temperature, and can have light-scattering properties at a second temperature, which is greater than the first temperature and is greater than the threshold temperature.

In various embodiments, the matrix of the thermotropic layer 204 may include a matrix material (for example a polymer matrix, for example a resin) in which thermotropic particles (for example microparticles, for example microcapsules having a refractive index that is variable in a temperature-dependent manner) are embedded, which are designed in such a way that they vary their refractive index depending on temperature. In various exemplary embodiments, the thermotropic layer 204 can have a layer structure in which the matrix material is arranged between translucent or transparent layers (for example polymer layers and/or glass layers).

In various embodiments, the thermotropic layer 204 can have the layer structure obtainable from the company Tilse under the designation Solardim®.

In various embodiments, the thermotropic layer 204 can have a layer thickness in a range of approximately 1 µm to approximately 1000 µm, for example a layer thickness in a range of approximately 10 µm to approximately 500 µm, for example a layer thickness in a range of approximately 20 µm to approximately 200 µm.

An electrically active region 206 of the light-emitting component 200 can be arranged on or above the thermotropic layer 204. The electrically active region 206 can be understood as that region of the light-emitting component 200 in which an electric current for the operation of the light-emitting component 200 flows. In various exemplary embodiments, the electrically active region 206 can have a first electrode 208, a second electrode 210 and an organic functional layer structure 212, as will be explained in even greater detail below.

In this regard, in various embodiments, the first electrode 208 (for example in the form of a first electrode layer 208)

may be applied on or above the thermotropic layer 204. The first electrode 208 (also designated hereinafter as bottom electrode 208) can be formed from an electrically conductive material, such as, for example, a metal or a transparent conductive oxide (TCO) or a layer stack having a plurality of layers of the same metal or different metals and/or the same TCO or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and may be used in various embodiments. Furthermore, the TCOs do not necessarily correspond to a stoichiometric composition and can furthermore be p-doped or n-doped.

In various embodiments, the first electrode 208 may include a metal; for example Ag, Pt, Au, Mg, Al, Ba, In, Ag, Au, Mg, Ca, Sm or Li, and compounds, combinations or alloys of these materials.

In various embodiments, the first electrode 208 may be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

In various embodiments, the first electrode 208 may provide one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires.

Furthermore, the first electrode 208 may include electrically conductive polymers or transition metal oxides or transparent electrically conductive oxides.

For the case where the light-emitting component 200 emits light through the substrate 202, the first electrode 208 and the substrate 202 can be formed as translucent or transparent. In this case, for the case where the first electrode 208 is formed from a metal, the first electrode 208 can have for example a layer thickness of less than or equal to approximately 25 nm, for example a layer thickness of less than or equal to approximately 20 nm, for example a layer thickness of less than or equal to approximately 18 nm. Furthermore, the first electrode 208 can have for example a layer thickness of greater than or equal to approximately 10 nm, for example a layer thickness of greater than or equal to approximately 15 nm. In various embodiments, the first electrode 208 can have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case of a translucent or transparent first electrode 208 and for the case where the first electrode 208 is formed from a transparent conductive oxide (TCO), the first electrode 208 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case of a translucent or transparent first electrode 208 and for the case where the first electrode 208 is formed from, for example, a network composed of metallic nanowires, for example composed of Ag, which can be combined with conductive polymers, a network composed of carbon nanotubes which can be combined with conductive polymers, or from graphene layers and composites, the first electrode 208 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

For the case where the light-emitting component 200 emits light exclusively toward the top, the first electrode 208 can also be designed as opaque or reflective. In this case, the first electrode 208 (for example for the case of a metallic electrode) can have for example a layer thickness of greater than or equal to approximately 40 nm, for example a layer thickness of greater than or equal to approximately 50 nm.

The first electrode 208 can be fouled as an anode, that is to say as a hole-injecting electrode, or as a cathode, that is to say as an electron-injecting electrode.

The first electrode 208 may have a first electrical terminal, to which a first electrical potential (provided by an energy store (not illustrated) for example a current source or a voltage source) can be applied. Alternatively, the first electrical potential may be applied to the substrate 202 and then be fed indirectly to the first electrode 208 via said substrate. The first electrical potential may be, for example, the ground potential or some other predefined reference potential.

Furthermore, the electrically active region 206 of the light-emitting component 200 may have an organic electroluminescent layer structure 210, which is applied on or above the first electrode 208.

The organic electroluminescent layer structure 210 may contain one or a plurality of emitter layers 212, for example including fluorescent and/or phosphorescent emitters, and one or a plurality of hole-conducting layers 214 (also designated as hole transport layer(s) 214). In various embodiments, one or a plurality of electron-conducting layers 216 (also designated as electron transport layer(s) 216) can alternatively or additionally be provided.

Examples of emitter materials which can be used in the light-emitting component 200 in accordance with various exemplary embodiments for the emitter layer(s) 212 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)-iridium III), green phosphorescent $Ir(ppy)_3$ (tris(2-phenylpyridine)iridium III), red phosphorescent Ru$(dtb-bpy)_3*2(PF_6)$ (tris[4,4'-di-tert-butyl-(2,2')-bipyridine] ruthenium (III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyran) as non-polymeric emitters. Such non-polymeric emitters can be deposited by means of thermal evaporation, for example. Furthermore, it is possible to use polymer emitters, which can be deposited, in particular, by means of a wet-chemical method such as spin coating, for example.

The emitter materials may be embedded in a matrix material in a suitable manner.

It should be pointed out that other suitable emitter materials are likewise provided in other embodiments.

The emitter materials of the emitter layer(s) 212 of the light-emitting component 200 can be selected for example such that the light-emitting component 200 emits white light. The emitter layer(s) 212 may include a plurality of emitter materials that emit in different colors (for example blue and yellow or blue, green and red); alternatively, the emitter layer(s) 212 can also be constructed from a plurality of partial layers, such as a blue fluorescent emitter layer 212 or blue phosphorescent emitter layer 212, a green phosphorescent emitter layer 212 and a red phosphorescent emitter layer 212. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The organic electroluminescent layer structure 210 may generally include one or a plurality of electroluminescent layers. The one or the plurality of electroluminescent layers may include organic polymers, organic oligomers, organic monomers, organic small, non-polymeric molecules ("small molecules") or a combination of these materials. By way of example, the organic electroluminescent layer structure 210 may include one or a plurality of electroluminescent layers embodied as a hole transport layer 214, so as to enable for example in the case of an OLED an effective hole injection into an electroluminescent layer or an electroluminescent region. Alternatively, in various embodiments, the organic electroluminescent layer structure may include one or a plurality of functional layers embodied as an electron transport layer 216, so as to enable for example in the case of an OLED an effective electron injection into an electroluminescent layer or an electroluminescent region. By way of example, tertiary amines, carbazo derivatives, conductive polyaniline or polyethylene dioxythiophene can be used as material for the hole transport layer 214. In various embodiments, the one or the plurality of electroluminescent layers may be embodied as an electroluminescent layer.

In various embodiments, the hole transport layer 214 can be applied, for example deposited, on or above the first electrode 208, and the emitter layer 212 can be applied, for example deposited, on or above the hole transport layer 214.

In various embodiments, the organic electroluminescent layer structure 210 (that is to say for example the sum of the thicknesses of hole transport layer(s) 214 and emitter layer(s) 216 may have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 210 can have for example a stack of a plurality of organic light-emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic electroluminescent layer structure 210 can have for example a stack of three or four OLEDs arranged directly one above another, in which case for example the organic electroluminescent layer structure 210 can have a layer thickness of a maximum of approximately 3 µm.

The light-emitting component 200 may optionally generally include further organic functional layers, for example arranged on or above the one or the plurality of emitter layers 212, which serve to further improve the functionality and thus the efficiency of the light-emitting component 200.

A second electrode 218 (for example in the form of a second electrode layer 212) can be applied on or above the organic electroluminescent layer structure 210 or, if appropriate, on or above the one or the plurality of further organic functional layers.

In various embodiments, the second electrode 218 may include or be formed from the same materials as the first electrode 208, metals being particularly suitable in various embodiments.

In various embodiments, the second electrode 218 (for example for the case of a metallic second electrode 218) can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 218 may generally be formed in a similar manner to the first electrode 208, or differently than the latter. In various embodiments, the second electrode 218 may be formed from one or more of the materials and with the respective layer thickness (depending on whether the second electrode is intended to be formed as reflective, translucent or transparent) as described above in connection with the first electrode 208. In the embodiment illustrated in FIG. 2, the second electrode 218 may be formed as reflective. Consequently, the light-emitting component 200 illustrated in FIG. 2 may be designed as a bottom emitter.

The second electrode 218 may be formed as an anode, that is to say as a hole-injecting electrode, or as a cathode, that is to say as an electron-injecting electrode.

The second electrode 218 may have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

Consequently, illustratively the thermotropic layer 204 is arranged outside the electrically active region 206, for example, as in the embodiment illustrated in FIG. 2, between the substrate 202 and the first electrode 208 of the electrically active region 206.

An encapsulation 220, for example in the form of a barrier thin-film layer/thin-film encapsulation 220, can optionally also be formed on or above the second electrode 112 and thus on or above the electrically active region 206.

In the context of this application, a "barrier thin-film layer" or a "barrier thin film" 220 can be understood to mean, for example, a layer or a layer structure which is suitable for forming a barrier against chemical impurities or atmospheric substances, in particular against water (moisture) and oxygen. In other words, the barrier thin-film layer 220 is formed in such a way that OLED-damaging substances such as water, oxygen or solvent cannot penetrate through it or at most very small proportions of said substances can penetrate through it.

In accordance with one configuration, the barrier thin-film layer 220 can be formed as an individual layer (to put it another way, as a single layer). In accordance with an alternative configuration, the barrier thin-film layer 220 may include a plurality of partial layers formed one on top of another. In other words, in accordance with one configuration, the barrier thin-film layer 220 can be formed as a layer stack. The barrier thin-film layer 220 or one or a plurality of partial layers of the barrier thin-film layer 220 can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 220 having a plurality of partial layers, all the partial layers can be formed by means of an atomic layer deposition method. A layer sequence having only ALD layers can also be designated as a "nanolaminate".

In accordance with an alternative configuration, in the case of a barrier thin-film layer 220 having a plurality of partial layers, one or a plurality of partial layers of the barrier thin-film layer 220 may be deposited by means of a different deposition method than an atomic layer deposition method, for example by means of a vapor deposition method.

In accordance with one configuration, the barrier thin-film layer 220 may have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 220 includes a plurality of partial layers, all the partial layers may have the same layer thickness. In accordance with another configuration, the individual partial layers of the barrier thin-film layer 220 can have different layer thicknesses. In other words, at least one of the partial layers can have a different layer thickness than one or more other partial layers.

In accordance with one configuration, the barrier thin-film layer 220 or the individual partial layers of the barrier thin-film layer 220 can be formed as a translucent or transparent layer. In other words, the barrier thin-film layer 220 (or the individual partial layers of the barrier thin-film layer 220) can consist of a translucent or transparent material (or a material combination that is translucent or transparent).

In accordance with one configuration, the barrier thin-film layer 220 or (in the case of a layer stack having a plurality of partial layers) one or a plurality of the partial layers of the barrier thin-film layer 220 may include or consist of one of the following materials: aluminum oxide, zinc oxide, zirconium oxide, titanium oxide, hafnium oxide, tantalum oxide, lanthanium oxide, silicon oxide, silicon nitride, silicon oxynitride, indium tin oxide, indium zinc oxide, aluminum-doped zinc oxide, and mixtures and alloys thereof.

In various embodiments, on or above the encapsulation 220 it is possible to provide an adhesive and/or a protective lacquer 222, by means of which, for example, an optional cover 224 (for example a glass cover 224, is fixed, for example adhesively bonded, on the encapsulation 220. In various embodiments, the optically translucent layer composed of adhesive and/or protective lacquer 222 can have a layer thickness of greater than 1 µm, for example a layer thickness of several µm. In various exemplary embodiments, the adhesive may include or be a lamination adhesive.

In various embodiments, light-scattering particles may also be embedded into the layer of the adhesive (also designated as adhesive layer), which particles can lead to a further improvement in the color angle distortion and the coupling-out efficiency. In various embodiments, the light-scattering particles provided can be dielectric scattering particles, for example, such as metal oxides, for example, such as e.g. silicon oxide ($SiO_2$), zinc oxide (ZnO), zirconium oxide ($ZrO_2$), indium tin oxide (ITO) or indium zinc oxide (IZO), gallium oxide ($Ga_2Oa$), aluminum oxide, or titanium oxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as the light-scattering particles.

In various embodiments, between the second electrode 218 and the layer composed of adhesive and/or protective lacquer 222 an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

Figure 3:
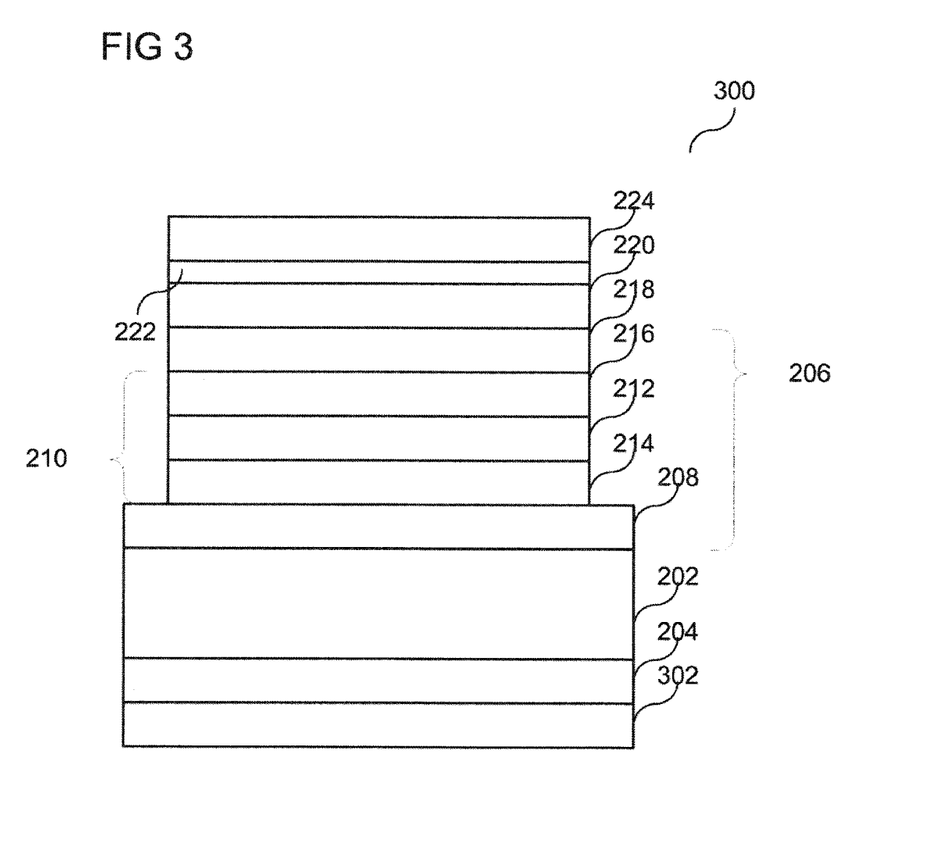
FIG. 3 shows a cross-sectional view of a light-emitting component in accordance with various embodiments.

FIG. 3 shows a cross-sectional view of a light-emitting component 300 in accordance with various embodiments.

The organic light-emitting diode 300 in accordance with FIG. 3 is identical in many aspects to the organic light-emitting diode 200 in accordance with FIG. 2, for which reason only the differences between the organic light-emitting diode 300 in accordance with FIG. 3 and the organic light-emitting diode 200 in accordance with FIG. 2 are explained in greater detail below; with regard to the remaining elements of the organic light-emitting diode 300 in accordance with FIG. 3, reference is made to the above explanations concerning the organic light-emitting diode 200 in accordance with FIG. 2.

In various embodiments, the light-emitting component 300 can be designed as a bottom emitter.

In contrast to the organic light-emitting diode 200 in accordance with FIG. 2, in the case of the organic light-emitting diode 300 in accordance with FIG. 3, the thermotropic layer 204 is not arranged between the substrate 202 and the electrically active region 206, but rather on that side of the substrate 202 which faces away from the electrically active region 206, to put it another way for example below the substrate 202. Furthermore, in various embodiments, a further cover 302 (for example a glass cover 302) can optionally also be provided, which can be arranged below the thermotropic layer 204. Consequently, in various embodiments, the further cover 302 can be arranged on that side of the substrate 202 which faces away from the electrically active region 206 and the thermotropic layer 204 can be arranged between the substrate 202 and the further cover 302.

Consequently, in these embodiments, the first electrode 208 can be in physical contact with the substrate 202 on one side of the substrate 202, and the thermotropic layer 204 can be in physical contact with the substrate 202 on the opposite side of the substrate 202.

Figure 4:
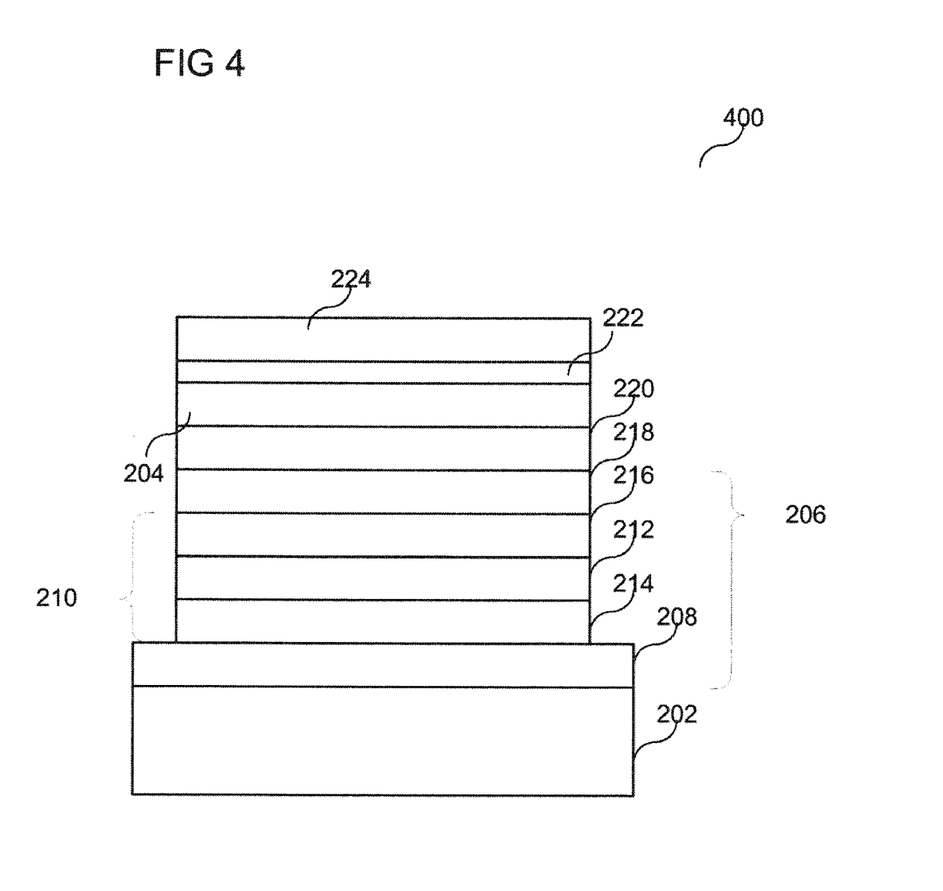
FIG. 4 shows a cross-sectional view of a light-emitting component in accordance with various embodiments.

FIG. 4 shows a cross-sectional view of a light-emitting component 400 in accordance with various embodiments.

The organic light-emitting diode 400 in accordance with FIG. 4 is identical in many aspects to the organic light-emitting diode 200 in accordance with FIG. 2, for which reason only the differences between the organic light-emitting diode 400 in accordance with FIG. 4 and the organic light-emitting diode 200 in accordance with FIG. 2 are explained in greater detail below; with regard to the remaining elements of the organic light-emitting diode 400 in accordance with FIG. 4, reference is made to the above explanations concerning the organic light-emitting diode 200 in accordance with FIG. 2.

In various embodiments, the light-emitting component 400 may be designed as a top emitter. This means, for example, that the first electrode 208 can be formed as reflective and that the second electrode 218 can be formed as optically transparent.

In contrast to the organic light-emitting diode 200 in accordance with FIG. 2, in the case of the organic light-emitting diode 400 in accordance with FIG. 4, the thermotropic layer 204 is not arranged between the substrate 202 and the electrically active region 206, but rather on or above the encapsulation 220. In these embodiments, optionally the optically translucent layer composed of adhesive and/or protective lacquer 222 can be arranged on or above the thermotropic layer 204 and fix, for example fixedly adhesively bond, the cover 224 on the thermotropic layer 204.

Figure 5:
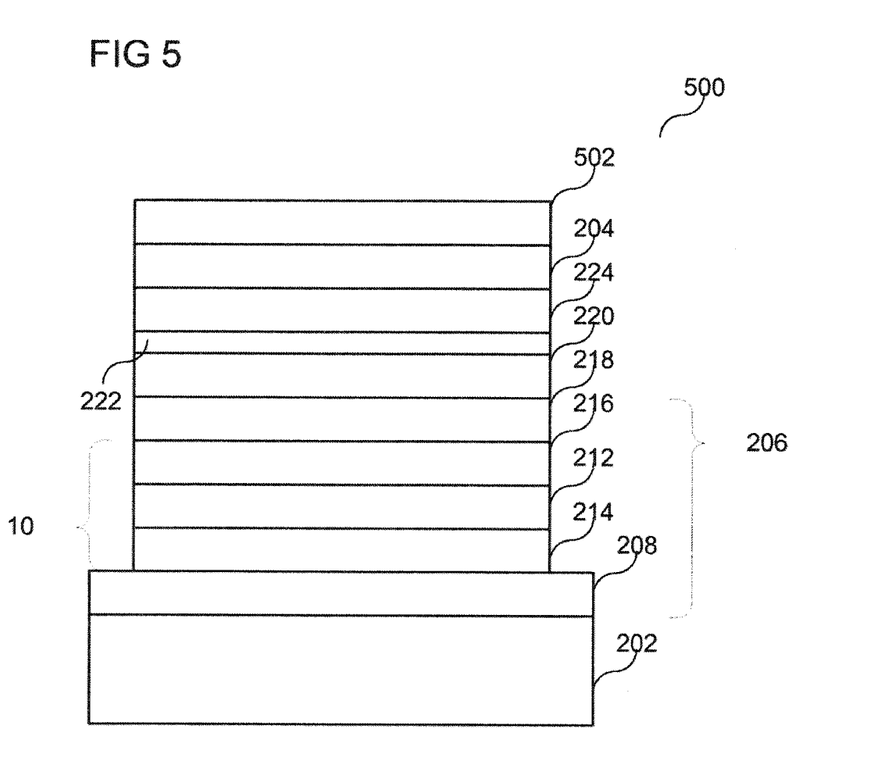
FIG. 5 shows a cross-sectional view of a light-emitting component in accordance with various embodiments.

FIG. 5 shows a cross-sectional view of a light-emitting component 500 in accordance with various embodiments.

The organic light-emitting diode 500 in accordance with FIG. 5 is identical in many aspects to the organic light-emitting diode 200 in accordance with FIG. 2, for which reason only the differences between the organic light-emitting diode 500 in accordance with FIG. 5 and the organic light-emitting diode 200 in accordance with FIG. 2 are explained in greater detail below; with regard to the remaining elements of the organic light-emitting diode 500 in accordance with FIG. 5, reference is made to the above explanations concerning the organic light-emitting diode 200 in accordance with FIG. 2.

In various embodiments, the light-emitting component 500 may be designed as a top emitter. This means, for example, that the first electrode 208 may be formed as reflective and that the second electrode 218 may be formed as optically transparent.

In contrast to the organic light-emitting diode 200 in accordance with FIG. 2, in the case of the organic light-emitting diode 500 in accordance with FIG. 5, the thermotropic layer 204 is not arranged between the substrate 202 and the electrically active region 206, but rather on or above the cover 224. Furthermore, an additional cover 502 (for example an additional glass cover 502) can optionally also be arranged on or above the thermotropic layer 204.

Figure 6:
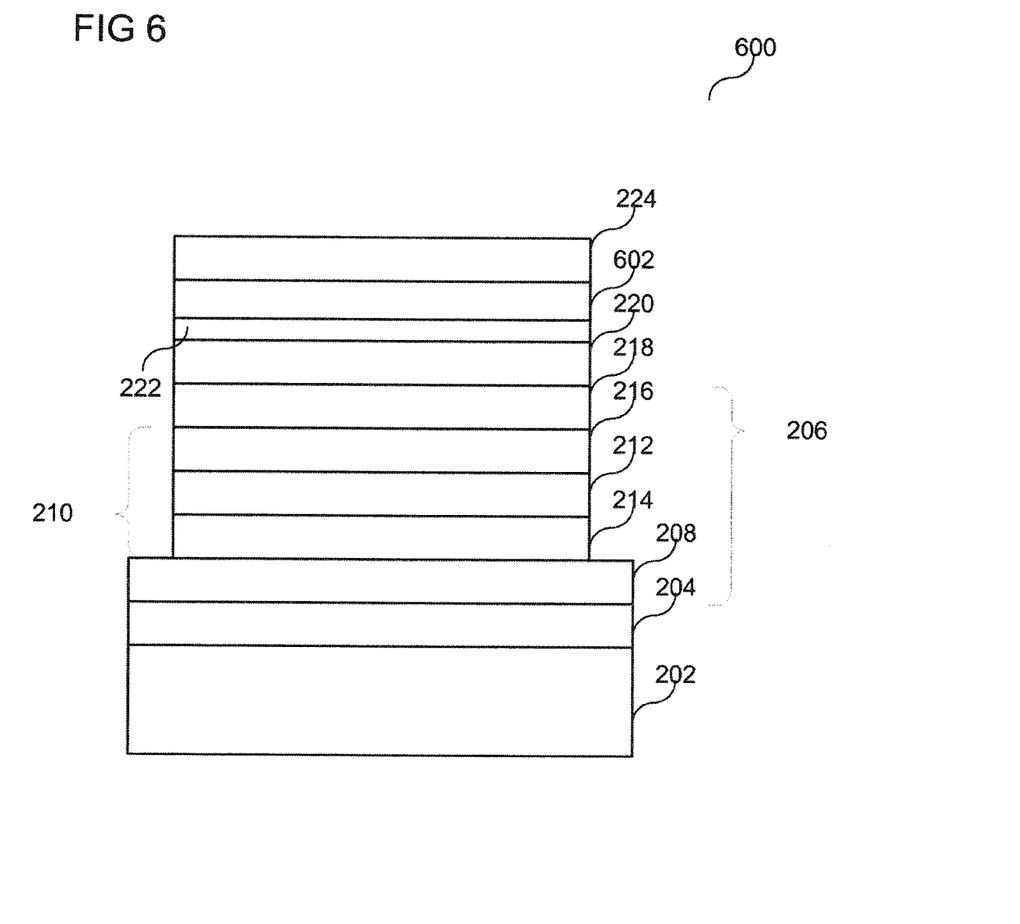
FIG. 6 shows a cross-sectional view of a light-emitting component in accordance with various embodiments.

FIG. 6 shows a cross-sectional view of a light-emitting component 600 in accordance with various embodiments.

The organic light-emitting diode 600 in accordance with FIG. 6 is identical in many aspects to the organic light-emitting diode 200 in accordance with FIG. 2, for which reason only the differences between the organic light-emitting diode 600 in accordance with FIG. 6 and the organic light-emitting diode 200 in accordance with FIG. 2 are explained in greater detail below; with regard to the remaining elements of the organic light-emitting diode 600 in accordance with FIG. 6, reference is made to the above explanations concerning the organic light-emitting diode 200 in accordance with FIG. 2.

In various embodiments, the light-emitting component 600 can be designed as a transparent light-emitting component 600, to put it another way can be designed as a top and bottom emitter. This means, for example, that the first electrode 208 and the second electrode 218 can be formed as optically transparent.

In addition to the organic light-emitting diode 200 in accordance with FIG. 2, in the case of the organic light-emitting diode 600 in accordance with FIG. 6, an additional thermotropic layer 602 is also provided, which can be arranged between the layer composed of adhesive and/or protective lacquer 222 and the cover 224.

In various embodiments, the additional thermotropic layer 602 can be designed in the same way as the thermotropic layer 204.

Figure 7:
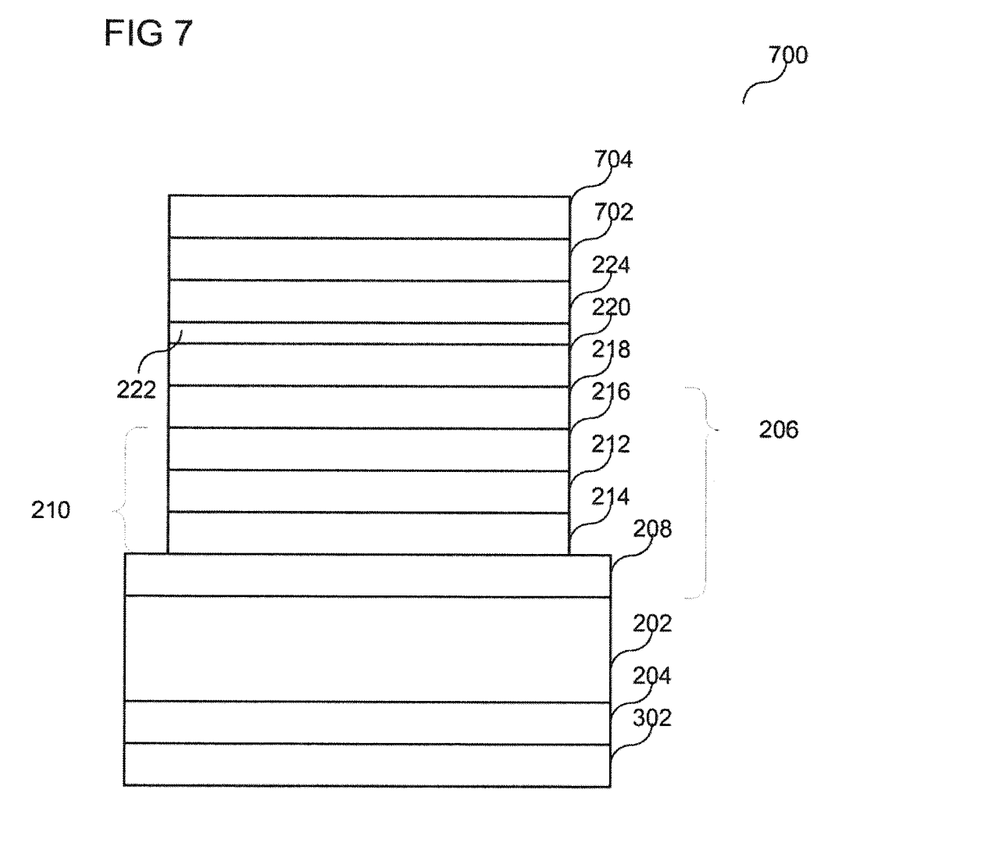
FIG. 7 shows a cross-sectional view of a light-emitting component in accordance with various embodiments.

FIG. 7 shows a cross-sectional view of a light-emitting component 700 in accordance with various embodiments.

The organic light-emitting diode 700 in accordance with FIG. 7 is identical in many aspects to the organic light-emitting diode 300 in accordance with FIG. 3, for which reason only the differences between the organic light-emitting diode 700 in accordance with FIG. 7 and the organic light-emitting diode 300 in accordance with FIG. 3 are explained in greater detail below; with regard to the remaining elements of the organic light-emitting diode 700 in accordance with FIG. 7, reference is made to the above explanations concerning the organic light-emitting diode 300 in accordance with FIG. 3 and the organic light-emitting diode 200 in accordance with FIG. 2.

In various embodiments, the light-emitting component 700 may be designed as a transparent light-emitting component 700, to put it another way can be designed as a top and bottom emitter. This means, for example, that the first electrode 208 and the second electrode 218 may be formed as optically transparent.

In addition to the organic light-emitting diode 300 in accordance with FIG. 3, in the case of the organic light-emitting diode 700 in accordance with FIG. 7, an additional thermotropic layer 702 is also provided, which may be arranged on or above the cover 224.

In various embodiments, the additional thermotropic layer 702 may be designed in the same way as the thermotropic layer 204.

Furthermore, an additional cover 704 (for example an additional glass cover 704) can optionally also be arranged on or above the additional thermotropic layer 702.

It should be pointed out that in various embodiments even with completely transparent light-emitting components, for example the organic light-emitting diode 600 in accordance with FIG. 6 or the organic light-emitting diode 700 in accordance with FIG. 7, in each case only one thermotropic layer 204, 602, 702 can be provided and the other can be omitted. It should be pointed out that in various embodiments the thermotropic layer can also be situated between the first electrode and the substrate.

The various embodiments make use of the fact that thermotropic layer(s) and/or thermotropic particles in a matrix (for example composed of resin or a polymer matrix) change their refractive index at specific temperatures. Since light-emitting components such as organic light-emitting diodes, for example, do not have 100 percent efficiency, however, they heat up during operation, i.e. for example when a current flow exists between the electrodes of the light-emitting component. This effect is utilized with thermotropic layer(s) and/or thermotropic particle(s) in various exemplary embodiments. In the switched-off state of a light-emitting component in accordance with various embodiments, the light-emitting component assumes for example the ambient temperature, for example room temperature. In the switched-on state, to put it another way during operation, of a light-emitting component in accordance with various exemplary embodiments, the light-emitting component heats up significantly (for example in the case of a high luminance provided by the light-emitting component) and the thermotropic layer(s) and/or thermotropic particle(s) change their refractive index.

As a result, the thermotropic layer(s) and/or the thermotropic particles become(s) translucent and this brings about light scattering that improves the coupling-out of the light from the light-emitting component, for example from the organic light-emitting diode. After the light-emitting component, for example the organic light-emitting diode, has been switched off, the substrate or the entire light-emitting component cools down again. In various embodiments, the thermotropic effect can be made reversible and the layers are thereby transparent again in the switched-off state of the light-emitting component.

In various embodiments, in the case of a light-emitting component that emits on one side, the specularly reflective switched-off state appearance is maintained and the coupling-out of light in the switched-off state, i.e. during operation, is improved.

Furthermore, in various embodiments in the case of a light-emitting component that emits on two sides, i.e. in the case of an optically transparent light-emitting component, the transparency in the switched-off state is maintained and the coupling-out of light in the switched-off state, i.e. during operation, is improved.

In various embodiments, the thermotropic layer may be positioned between the first electrode and the substrate (not illustrated).

Figure 8:
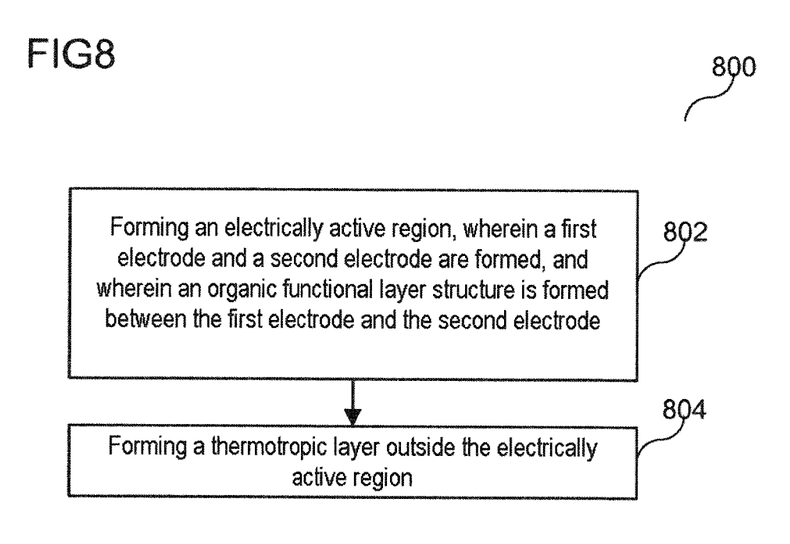
FIG. 8 shows a flow chart illustrating a method for producing a light-emitting component in accordance with various embodiments.

FIG. 8 shows a flow chart 800 illustrating a method for producing a light-emitting component in accordance with various embodiments.

In 802 an electrically active region is formed, wherein a first electrode and a second electrode are formed, and wherein an organic functional layer structure is formed between the first electrode and the second electrode. Furthermore, in 804 a thermotropic layer can be formed outside the electrically active region.

The various layers, for example the thermotropic layer 204, the electrodes 208, 218 and the other layers of the electrically active region 206 such as, for example, the organic functional layer structure 212, the hole transport layer(s) 214 or the electron transport layer(s) 216 can be applied, for example deposited, by means of various processes, for example by means of a CVD method (chemical vapor deposition) or by means of a PVD method (physical vapor deposition, for example sputtering, ion-assisted deposition method or thermal evaporation), alternatively by means of a plating method; a dip coating method; a spin coating method; printing; blade coating; or spraying.

In various embodiments, a plasma enhanced chemical vapor deposition (PE-CVD) method can be used as CVD method. In this case, a plasma can be generated in a volume above and/or around the element to which the layer to be applied is intended to be applied, wherein at least two gaseous starting compounds are fed to the volume, said compounds being ionized in the plasma and excited to react with one another. The generation of the plasma can make it possible that the temperature to which the surface of the element is to be heated in order to make it possible to produce the dielectric layer, for example, can be reduced in comparison with a plasmaless CVD method. That may be advantageous, for example, if the element, for example the light-emitting electronic component to be formed, would be damaged at a temperature above a maximum temperature. The maximum temperature can be approximately 120° C. for example in the case of a light-emitting electronic component to be formed in accordance with various embodiments, such that the temperature at which the dielectric layer for example is applied can be less than or equal to 120° C. and for example less than or equal to 80° C.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting component, comprising:
   an electrically active region, comprising:
      a first electrode;
      a second electrode; and
      an organic functional layer structure between the first electrode and the second electrode;
   a thermotropic layer, which is arranged outside the electrically active region;
   a substrate; and
   a first cover, wherein the first cover is arranged on the opposite side of the substrate from the electrically active region, wherein the thermotropic layer is arranged between the substrate and the first cover.

2. The light-emitting component as claimed in claim 1, wherein the thermotropic layer comprises a matrix material in which particles are embedded, which are designed in such a way that they vary their refractive index depending on temperature.

3. The light-emitting component as claimed in claim 2, wherein the matrix material comprises polymer material.

4. The light-emitting component as claimed in claim 2, wherein the particles comprise microparticles.

5. The light-emitting component as claimed in claim 1, further comprising an encapsulation, wherein the encapsulation is arranged on the opposite side of the electrically active region from the substrate;
   wherein the thermotropic layer is arranged above the encapsulation.

6. The light-emitting component as claimed in claim 1, further comprising:
   an encapsulation, wherein the encapsulation is arranged on the opposite side of the electrically active region from the substrate;
   a second cover arranged above the encapsulation;
   wherein the thermotropic layer is arranged above the second cover.

7. The light-emitting component as claimed in claim 1, further comprising:
   an encapsulation, wherein the encapsulation is arranged on that side of the electrically active region which faces away from the substrate; and
   a second thermotropic layer, wherein the second thermotropic layer is arranged above the encapsulation.

8. The light-emitting component as claimed in claim 1, further comprising:
   an encapsulation, wherein the encapsulation is arranged on that side of the electrically active region which faces away from the substrate;
   a second cover arranged above the encapsulation; and
   a second thermotropic layer, wherein the second thermotropic layer is arranged above the second cover.

9. The light-emitting component as claimed in claim 1, designed as an organic light-emitting diode.

10. A method for producing a light-emitting component, the method comprising:
    forming an electrically active region, comprising:
       forming a first electrode;
       forming a second electrode; and
       forming an organic functional layer structure between the first electrode and the second electrode;
    forming a thermotropic layer outside the electrically active region;
    forming a substrate; and
    forming a first cover on the opposite side of the substrate from the electrically active region, wherein the thermotropic layer is arranged between the substrate and the first cover.

* * * * *